United States Patent
Chen et al.

(10) Patent No.: US 9,665,301 B2
(45) Date of Patent: May 30, 2017

(54) METHODS AND DEVICES FOR STORING USER DATA ALONG WITH ADDRESSES CORRESPONDING TO PHYSICAL PAGES STORING VALID DATA

(71) Applicant: MICRON TECHNOLOGY, INC., Boise, ID (US)

(72) Inventors: Frank Chen, North Potomac, MD (US); Yuan Rong, Shanghai (CN); Zhao Wei, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/004,150

(22) Filed: Jan. 22, 2016

(65) Prior Publication Data

US 2016/0139813 A1    May 19, 2016

Related U.S. Application Data (60) Continuation of application No. 14/274,146, filed on May 9, 2014, now Pat. No. 9,262,335, which is a
(Continued)

(30) Foreign Application Priority Data

Sep. 16, 2008    (CN) .......................... 2008 1 0149661

(51) Int. Cl.
*G06F 12/00* (2006.01)
*G06F 3/06* (2006.01)
(Continued)

(52) U.S. Cl.
CPC ............ *G06F 3/064* (2013.01); *G06F 3/0604* (2013.01); *G06F 3/0679* (2013.01); *G06F 12/0246* (2013.01); *G06F 12/1009* (2013.01); *G06F 12/12* (2013.01); *G06F 2212/657* (2013.01); *G06F 2212/69* (2013.01); *G06F 2212/7201* (2013.01); *G06F 2212/7207* (2013.01); *G11C 29/76* (2013.01)

(58) Field of Classification Search
USPC ....................................................... 711/103
See application file for complete search history.

(56) References Cited

U.S. PATENT DOCUMENTS

| | | |
|---|---|---|
| 4,068,303 A | 1/1978 | Morita |
| 6,697,797 B1 | 2/2004 | Hoggatt et al. |
| | (Continued) | |

FOREIGN PATENT DOCUMENTS

EP    0977121 A2    2/2000

*Primary Examiner* — Mardochee Chery
(74) *Attorney, Agent, or Firm* — Dicke, Billig & Czaja, PLLC (57) ABSTRACT

Methods, and corresponding devices, for storing user data along with a plurality of addresses corresponding to physical pages storing valid data corresponding to a logical data block are useful in re-building mapping information for the logical data block. Such methods include receiving data from an external device, combining the received data with a plurality of addresses, and writing the combined data to a free physical page, wherein each address of the plurality of addresses corresponds to a respective physical page associated with a respective logical page associated with valid data.

21 Claims, 7 Drawing Sheets

Related U.S. Application Data division of application No. 12/268,879, filed on Nov. 11, 2008, now Pat. No. 8,732,388.

(51) Int. Cl.
*G06F 12/02* (2006.01)
*G06F 12/1009* (2016.01)
*G06F 12/12* (2016.01)
*G11C 29/00* (2006.01)

(56) References Cited

U.S. PATENT DOCUMENTS

| | | |
|---|---|---|
| 6,973,558 B2 | 12/2005 | Hudson |
| 7,664,906 B2 | 2/2010 | Chung et al. |
| 8,261,133 B1 | 9/2012 | Ali-Santosa et al. |
| 2003/0093610 A1 | 5/2003 | Lai et al. |
| 2004/0085849 A1* | 5/2004 | Myoung ............ G06F 12/0246 365/232 |
| 2004/0255092 A1 | 12/2004 | Nishikawa et al. |
| 2005/0132125 A1 | 6/2005 | Gan et al. |
| 2007/0083697 A1 | 4/2007 | Birrell et al. |
| 2007/0192533 A1 | 8/2007 | Kim et al. |
| 2008/0098193 A1 | 4/2008 | Im et al. |
| 2008/0177937 A1* | 7/2008 | Nishihara ........... G06F 12/0246 711/103 |
| 2009/0271564 A1 | 10/2009 | Sugimoto et al. |
| 2016/0055053 A1* | 2/2016 | Trantham ........... G06F 11/1004 714/807 |

\* cited by examiner

METHODS AND DEVICES FOR STORING USER DATA ALONG WITH ADDRESSES CORRESPONDING TO PHYSICAL PAGES STORING VALID DATA

RELATED APPLICATIONS

This application is a Continuation of U.S. Ser. No. 14/274,146 filed on May 9, 2014 , now U.S. Pat. No. 9,262,335, issued on Feb. 16, 2016, , entitled "RE-BUILDING MAPPING INFORMATION FOR MEMORY DEVICES," which is a Divisional of U.S. Ser. No. 12/268,879 filed on Nov. 11, 2008, entitled "EMBEDDED MAPPING INFORMATION FOR MEMORY DEVICES," now U.S. Pat. No. 8,732,388, issued on May 20, 2014, which are commonly assigned and incorporated by reference in their entirety herein. This application further claims priority to Chinese Patent Application Serial No. 200810149661.5 filed Sep. 16, 2008, entitled "EMBEDDED MAPPING INFORMATION FOR MEMORY DEVICES," which is commonly assigned.

TECHNICAL FIELD

The present disclosure relates generally to semiconductor memory, and in particular, in one or more embodiments, the present disclosure relates to methods and apparatus utilizing embedded mapping information for memory devices.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but often include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage nodes (e.g., floating gates or trapping layers) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost for equivalent storage capacities.

Due to the nature of flash memory devices, the physical location within a flash memory device for a given logical address will generally change over time. To address this changing correspondence, a Flash Translation Layer (FTL) is used to map the logical address to the physical address to which data has been stored. Although this high-level mapping information is often held in volatile memory for ease of use during operation of the memory device, such mapping information is periodically stored to non-volatile memory so that it may be retrieved during start-up of the device. Alternatively, this mapping information may be updated to non-volatile storage with each write operation. If an SSD is powered down abruptly, such that the most recent mapping information has not been stored to non-volatile memory, every valid page of the memory devices forming the SSD is scanned to re-build the relationship between logical addresses and current physical addresses. This scanning can take a significant amount of time, during which the SSD is unavailable to the host.

For the reasons stated above, and for other reasons which will become apparent to those skilled in the art upon reading and understanding the present specification, there is a need in the art for alternative bulk storage options.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Figure 1:
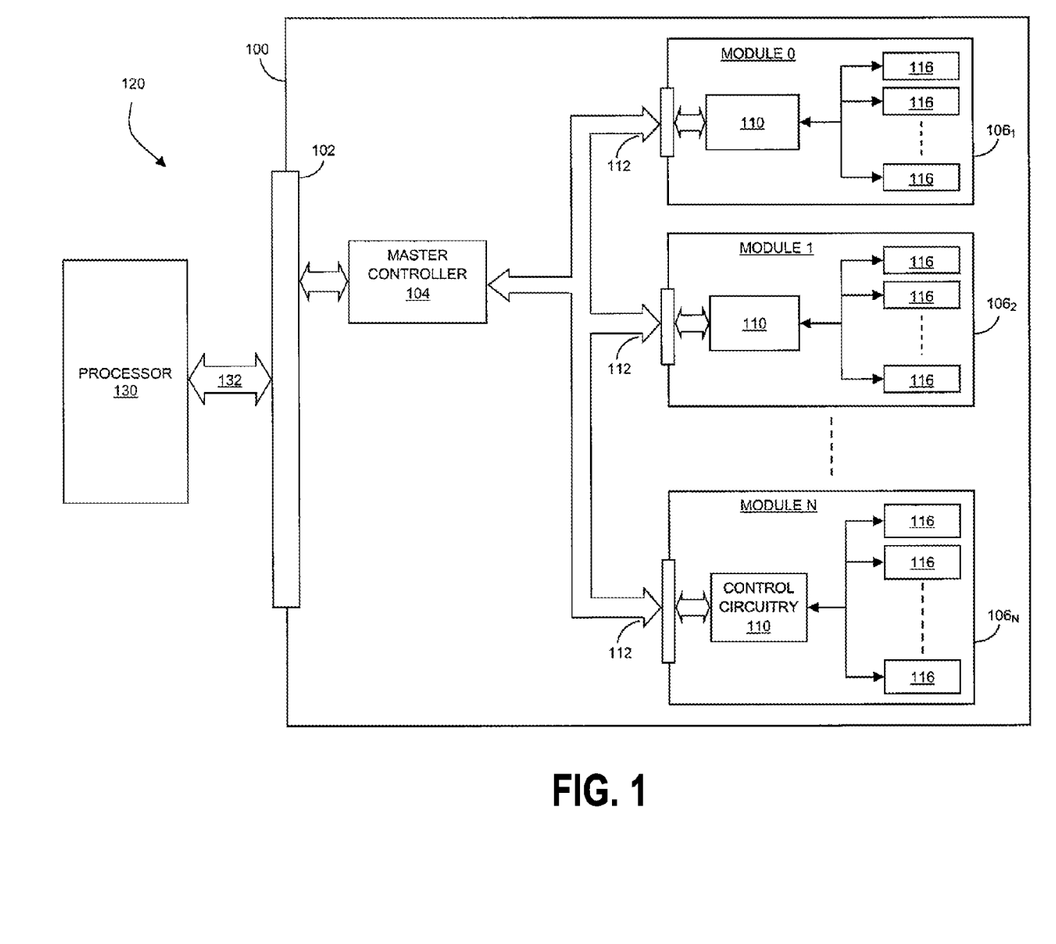
FIG. 1 is a functional block diagram of an electronic system having at least one memory module according to an embodiment of the disclosure.

FIG. 1 is a block diagram of a solid state drive (SSD) 100 in communication with (e.g., coupled to) a processor 130 as part of an electronic system 120, according to one embodiment of the disclosure. The electronic system 120 may be considered a host of the SSD 100 in that it controls the operation of the SSD 100 through its processor 130. Some examples of electronic systems include personal computers, laptop computers, personal digital assistants (PDAs), digital cameras, digital media players, digital recorders, electronic games and the like. The processor 130 may be a disk drive controller or other external processor. Typically there exists a communication bus 132 employing a standard protocol that is used to connect the processor 130 and the SSD 100. The communication bus 132 typically consists of multiple signals including address, data, power and various I/O signals. The type of communication bus 132 will depend on the type of drive interface being utilized in the system 120. Examples of some conventional disk drive interface bus protocols are IDE, ATA, SATA, PATA, Fibre Channel and SCSI. Other drive interfaces exist and are known in the art. It should be noted that FIG. 1 has been simplified to focus on the embodiments of the disclosure. Additional or different components, connections and I/O signals could be implemented as are known in the art without departing from the scope of the disclosure. For example, the SSD 100 could include power conditioning/distribution circuitry, volatile memory and its controller, etc. However, such additional components are not necessary to an understanding of this disclosure.

The SSD 100 according to one embodiment of the disclosure, as illustrated in FIG. 1, includes an interface 102 to allow a processor 130, e.g., a drive controller, to interact with the SSD 100 over communication bus 132. The interface 102 may be one of many standardized connectors commonly known to those skilled in the art. Some examples of these interface 102 connectors are IDE, ATA, SATA and PCMCIA connectors. As various embodiments of the disclosure can be configured to emulate a variety of conventional type HDDs, other disk drive connectors may also be utilized at the interface 102.

The SSD 100 of FIG. 1 also includes a master controller 104 and a number of memory modules $106_1$-$106_N$. Some of the functions performed by the master controller 104 are to manage operations within the SSD 100 and communicate with devices external to the SSD 100 such as the processor 130 over the communication bus 132. Memory modules $106_1$-$106_N$ act as the bulk storage media for the SSD 100.

The master controller 104 manages the various operations of the SSD 100. As discussed, an SSD 100 may be used as a drop in replacement for a standard HDD and there exist many standardized HDDs which have standard interfaces and communication protocols. Thus, one of the many functions of the master controller 104 is to emulate the operation of one of these standardized HDD protocols. Another function of the master controller 104 is to manage the operation of the memory modules 106 installed in the SSD 100. The master controller 104 can be configured to communicate with the memory modules 106 using a variety of standard communication protocols. For example, in one embodiment of the disclosure, the master controller 104 interacts with the memory modules 106 using a SATA protocol. Other embodiments may utilize other communication protocols to communicate with the memory modules 106. The master controller 104 may also perform additional functions relating to the memory modules such as error correction code (ECC) checking. Implementation of the master controller 104 may be accomplished by using hardware or a hardware/software combination. For example, the master controller 104 may be implemented in whole or in part by a state machine.

Memory modules 106 are coupled to the master controller 104 using internal communication bus 112. Communication between the master controller 104 and the memory modules 106 may be implemented by utilizing a common bus 112 as shown, and/or discrete connections between the master controller 104 and each memory module 106.

Control circuitry 110 manages the operation of the non-volatile memory devices 116 on its corresponding memory module $106_1$-$106_N$. Memory devices 116 may be flash memory devices. The control circuitry 110 may also act to translate the communication protocol utilized by the master controller 104 to communicate with the memory module $106_1$-$106_N$. For example, in one embodiment of the disclosure, the master controller 104 may be utilizing an SATA protocol to interact with the memory modules $106_1$-$106_N$. In such an embodiment, the control circuitry 110 is configured to emulate a SATA interface. The control circuitry 110 can also manage other memory functions such as security features to regulate access to data stored in the memory module and wear leveling. The control circuitry 110 is further configured to perform one or more methods of the present disclosure.

As noted above, due to the nature of flash memory devices, the physical location within a flash memory device for a given logical address will generally change over time. This occurs because storage locations in flash memory devices generally need to be erased before reprogramming. As such, if the data corresponding to a given logical address is to be changed, rather than erasing the existing physical location within the memory device and reprogramming it with the new data, the memory device simply writes the new data to a new physical location and marks the old physical location as obsolete.

Flash memory devices are typically organized as blocks of memory cells, which are further broken down into pages. As data is written to a block, it is written to the first free page of that block. Thus, a block can have a mix of valid and obsolete pages. When a block is full, the valid data may be copied to a free block for consolidation, often referred to as folding. However, for efficiency, a data block may have one or more log blocks associated with it. If log blocks are utilized, at the point when a data block is full, subsequent writes for that data block are written to the next free page of its one or more log blocks. In this manner, the folding operation is more efficient as it can be performed less frequently. Once valid pages are folded to a new block, the old data block and its log blocks, if any, are marked for erasure.

Figure 2:
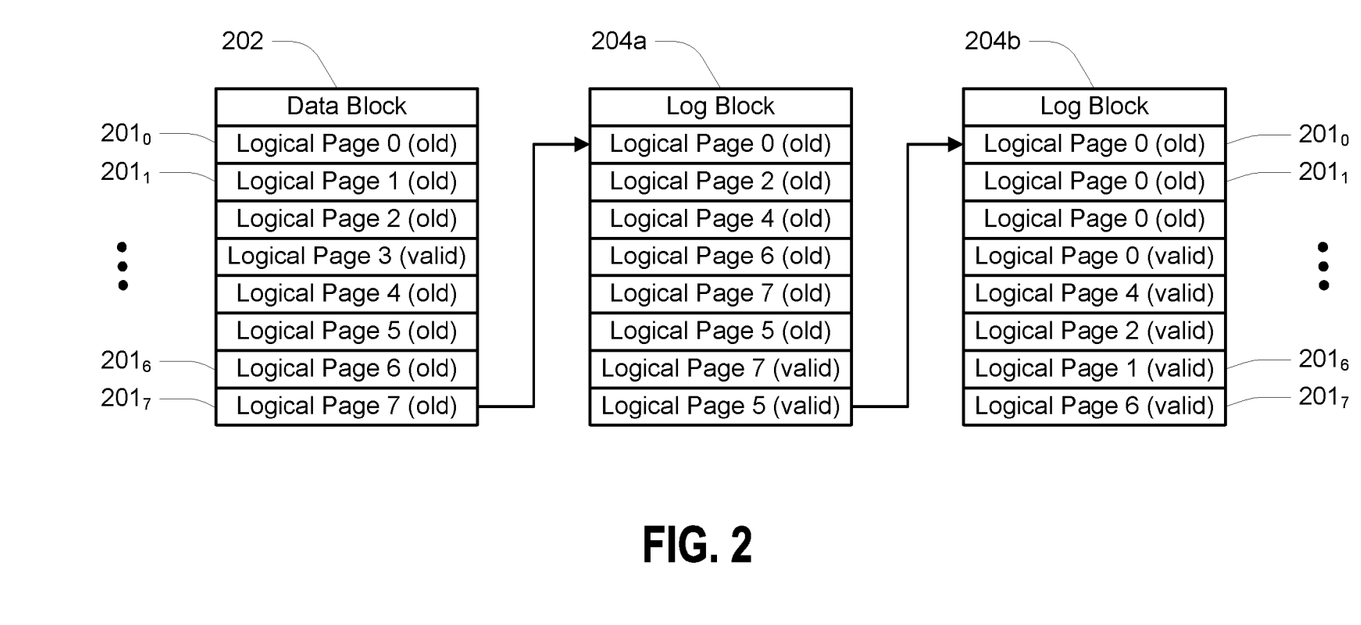
FIG. 2 is a representation of a data block and its associated log blocks in accordance with an embodiment of the disclosure.

An example of this process is shown in FIG. 2. FIG. 2 is a representation of a physical data block 202 and its associated physical log blocks 204a and 204b. The data block 202 and its associated log blocks 204a and 204b would be associated with a single logical block address. In this example, each of the blocks 202/204 includes 8 physical pages $201_0$-$201_7$. Data addressed to data block 202 started at physical page $201_0$ and proceeded to write 8 logical pages to the data block 202 through physical page $201_7$. When data block 202 was full, i.e., its last available physical page $201_7$ was written to, subsequent page writes went to log block 204a, proceeding in like fashion, and then to log block 204b.

As logical page 0 was first written to log block 204a in its physical page $201_0$, physical page $201_0$ of data block 202 was marked as old, and so on. As shown in FIG. 2, data block 202 has 8 valid pages 201 among itself and its associated log blocks 204.

The Flash Translation Layer (FTL) tracks the correspondence between the logical addresses and their corresponding physical address. If this mapping information is not updated due to a power loss or abrupt shutdown, it needs to be re-built by scanning the blocks of the memory device. Because write operations proceed sequentially through the pages of the blocks, this scanning process proceeds through the block in a reverse direction. For example, if there are 64 pages per block, and writes proceed in the direction of page 0 through page 63, the scan proceeds in the direction of page 63 through page 0. As a valid physical page is discovered, its corresponding logical address is updated in the mapping information. This process can consume a relatively substantial amount of time and power. Thus, with reference back to FIG. 2, the scanning would proceed beginning at physical page $201_7$ of log block 204b and proceed toward data block 202. As each valid physical page 201 is discovered, its corresponding logical page is updated in the mapping information. However, the scanning process must, in the example of FIG. 2, proceed until it reaches physical page $201_3$ of data block 202 before it has a complete correspondence of the mapping information for the logical block address corresponding to data block 202.

The various embodiments utilize embedded mapping information contained within the physical block corresponding to a logical block address. In particular, when a page is written to a block, that page includes a snapshot of the current mapping information for that block. In this manner, the last valid page of a block will contain a physical/logical mapping of that block. Thus, instead of scanning every valid page of the memory device to rebuild the mapping information, various embodiments may scan only for the last valid page associated with each logical block. Once a last valid page is discovered for a block, the latest mapping information for that block may be read from that page. Note that a last valid page of a block, i.e., the page most recently written to for that block, may occur in an associated log block if log blocks are utilized. Referring back to the example of FIG. 2, if the mapping information is embedded with user data stored to the last valid page for data block 202, i.e., physical page $201_7$ of log block 204b in this example, only that page need be scanned in order to develop the complete correspondence of mapping information for data block 202.

A page of data, while stored in physical locations, i.e., memory cells, may not be stored in a contiguous grouping of memory cells. For example, memory cells of one page of a block may be interleaved with memory cells of another page of that block, or even another block. In addition, or alternatively, a memory cell may store data from two pages of that block. For example, where multi-level cells are used to store more than one digit of data per memory cell, one digit might belong to one page and another digit might belong to another page. Thus, when reference is made to a physical page or a physical block, it refers to a grouping of memory cells logically associated as a page or a block, respectively. Furthermore, in the description of the data structure of a page or a block, a representation of a portion of the page or the block need not contain a contiguous physical grouping of memory cells or even a contiguous logical grouping of memory cells. For example, where a page of data may logically contain a first portion of user data, a second portion of metadata and a third portion of error correction code (ECC) data, the metadata and ECC data may be distributed among the user data both physically and logically, provided the controller is configured to be able to identify which memory cells contain the user data, which memory cells contain the metadata and which memory cells contain the ECC data.

Figure 3:
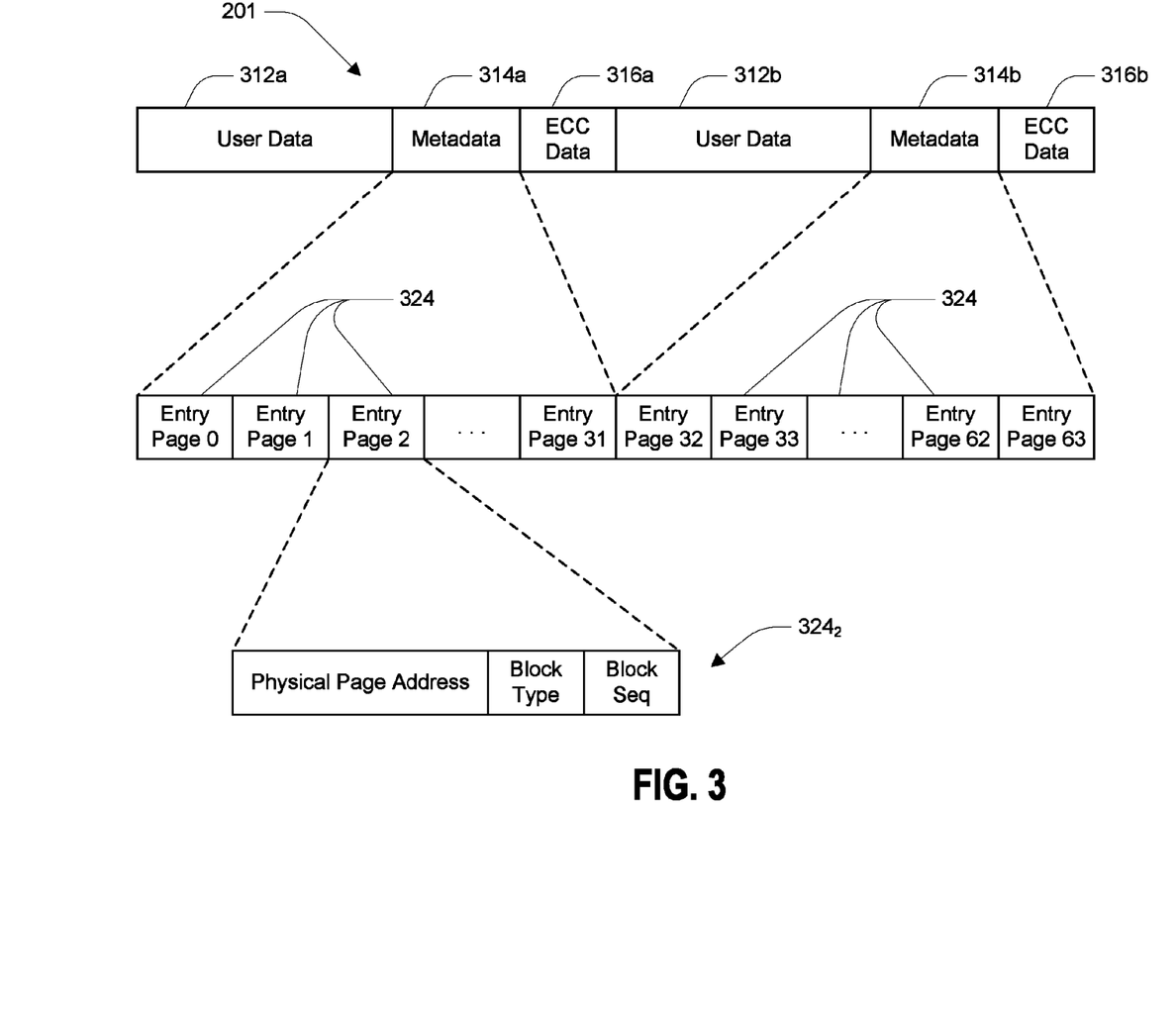
FIG. 3 is a representation of a data structure of a page in accordance with an embodiment of the disclosure.

FIG. 3 is a representation of one embodiment of a data structure of a page 201 in accordance with an embodiment of the disclosure. The page 201 has one or more user data portions 312, one or more metadata portions 314 and, optionally, one or more ECC portions 316. The ECC portions 316, in this example, include ECC data for both the user data portions 312 and the metadata portions 314. Although often stored together with user data, ECC data may be separately stored in a different page. In the example of FIG. 3, the ECC portion 316a may contain ECC data for the user data portion 312a and the metadata portion 314a while the ECC portion 316b may contain ECC data for the user data portion 312b and the metadata portion 314b. As one example, each user data portion 312 contains 2,048 Bytes of user data, each metadata portion 314 contains 32 Bytes of metadata (defined subsequently), and each ECC portion 316 contains 16 Bytes of ECC data. A page 201 may further include additional data portions (not shown) for other purposes a designer might choose. While generating ECC data would be more efficient using combined user data and metadata in the foregoing example, ECC data could be generated for each data portion separately.

The metadata portions 314 contain data representative of the mapping information for the logical data block to which the page 201 is associated. Thus, the metadata portions 314 contain the data sufficient to re-build the mapping correspondence between a logical address and a physical location containing the data corresponding to the logical address. Considering the example of a data block containing 64 physical pages and utilizing up to two log blocks, and an addressing scheme associating 64 logical page addresses to the data block, each metadata portion 314 might be subdivided into 32 metadata sub-portions 324, each representative of one logical page address. By indexing the metadata sub-portions 324 by their logical page offset, e.g., data corresponding to a first logical page of the block residing in a first metadata sub-portion 324, data corresponding to a second logical page of the block residing in a second metadata sub-portion 324, and data corresponding to a third logical page of the block residing in a third metadata sub-portion 324, etc., the metadata corresponding to physical mapping information for any logical page may be easily determined.

For one embodiment, the metadata corresponding to mapping information of a logical page contains data indicative of the physical page address where the data is stored for that logical page. For a further embodiment, the metadata may contain additional data. For example, where log blocks are used, the additional data may define whether the physical page is located in a data block or a log block associated with the data block, and may further define a sequence number of the log block containing that physical page where more than one log block is used. Thus, for the foregoing example, each metadata sub-portion 324 could contain 5 digits of data defining an address for one of the 64 pages of a block, 1 digit of data defining whether the block is the data block or a log block, e.g., logical 0 for a data block and logical 1 for a log block, and 1 digit of data defining which log block contains the addressed physical page, e.g., logical 0 for a first log block and logical 1 for a second log block. This further breakdown is shown with reference to metadata sub-portion $324_2$.

Figure 4A:
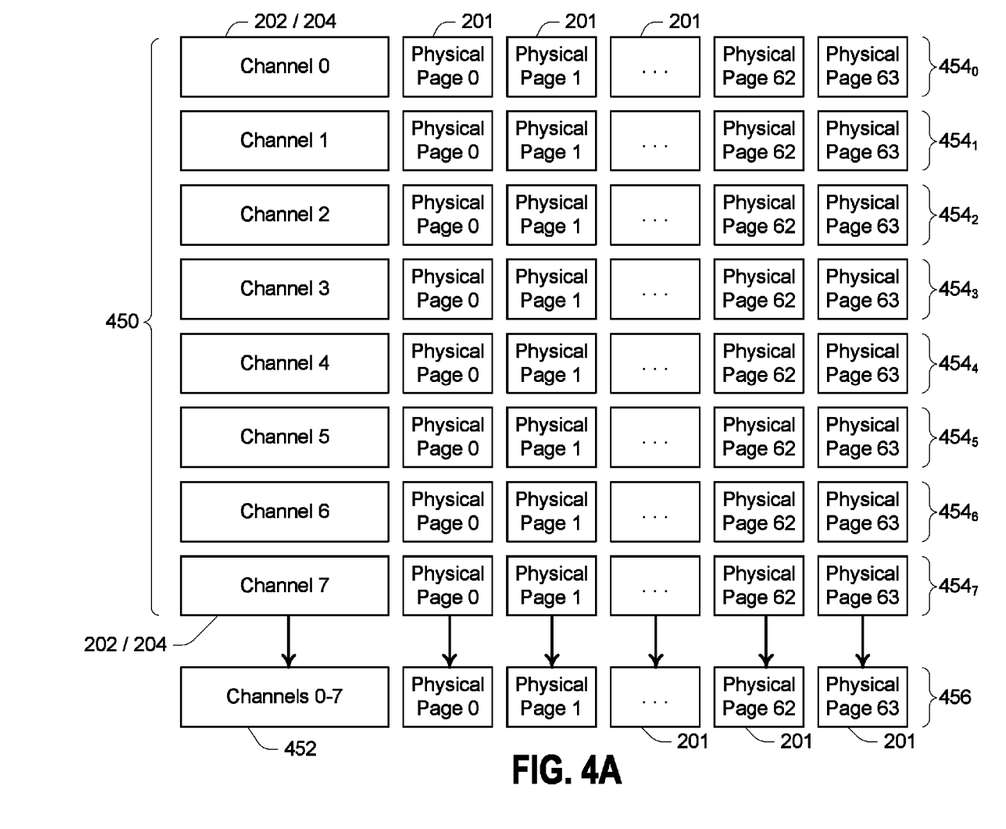
FIGS. 4A-4B are block representations of a logical data block combining multiple physical data blocks in accordance with an embodiment of the disclosure.
Figure 4B:
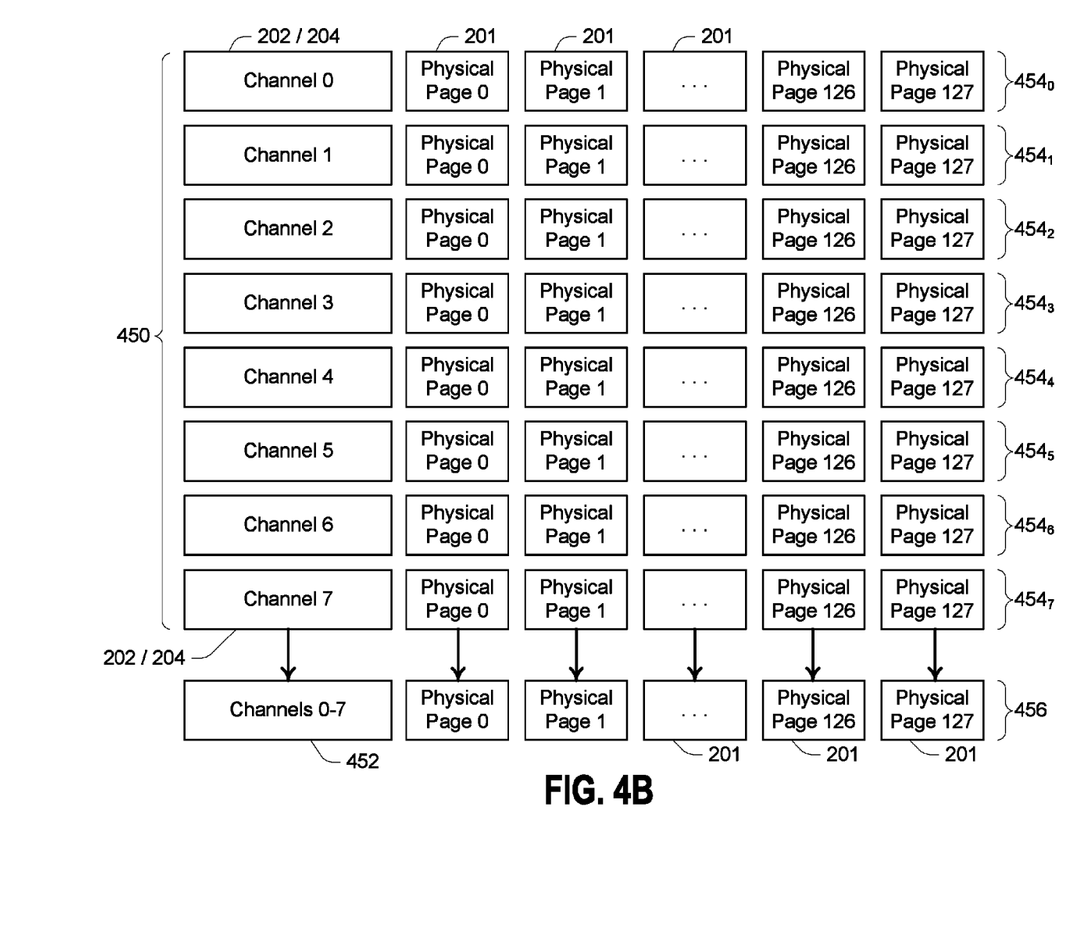

Various embodiments can be adapted for use with memory devices having insufficient physical space in any one physical page to store complete mapping information for the entire logical data block. This is taken care of by combining multiple physical data blocks, and any associated log blocks, to represent one logical data block. FIGS. 4A-4B show block representations of such embodiments.

In the example of FIG. 4A, a grouping 450 of multiple physical blocks 202/204, identified as separate channels 454 of a logical data block 456, is used to create a virtual data block 452. It is noted that each channel 454 may be associated with a data block 202 and, optionally, one or more log blocks 204 associated with that data block 202, as described with reference to FIG. 2. Each physical block 202/204 of the grouping 450 has multiple physical pages 201, also as described with reference to FIG. 2. However, instead of storing the complete mapping information for the logical data block 456 in the last valid page 201 of any single channel 454, the last valid page 201 of each channel 454 would store mapping information for only a portion of the logical data block 456. For example, if there are 64 pages per channel 454, and eight channels 454 are utilized, the last valid page 201 of any given channel 454 might store eight logical page entries of the mapping information of the logical block 454. Thus, the last valid page 201 of the channel $454_0$ could store mapping information for the first eight logical page addresses of the logical data block 456, the last valid page 201 of the channel $454_1$ could store mapping information for the next eight logical page addresses of the logical data block 456, the last valid page 201 of the channel $454_2$ could store mapping information for the next eight logical page addresses of the logical data block 456, and so on.

The logical data block 456 is treated as a single logical block such that a write operation would write data to the first free physical page of each of the channels 454 of the logical block 456. As one example, if each of the physical pages 201 of the grouping 450 included 4 KB of data per page, the physical pages 201 of the logical block 456 would have N times 4 KB of data per page, where N is the number of channels 454 used to create the virtual data block 452. In the example of FIG. 4A, N=8. Accordingly, each write operation would write 32 KB of data in this example. In this manner, by reading the last valid page of each of the channels 454, the complete mapping information for logical data block 456 may be retrieved. If the logical data block 456 is not treated as a single logical block, and write operations are permitted to individual channels 454, the mapping information would be outdated if the channel 454 receiving the new data did not contain the mapping information for the logical page address being written. Also, when treated as a single logical block, each logical page address will occur at the same physical page offset of their respective data block 202. If not treated as a single block, a subsequent write operation may identify a next free page at a different offset for different data blocks 202. This would require the storage of multiple physical addresses for a single logical page address. Furthermore, the write operations to each channel 454 may be concurrent or sequential. However, the write operation to the logical data block 456 should not be recognized by the control circuitry as complete until all channels 454 have completed their respective write operation.

In the example of FIG. 4B, a grouping 450 of multiple physical blocks 202/204, identified as separate channels 454 of a logical data block 456, is used to create a virtual data block 452. The description parallels that of the example of FIG. 4A except that physical blocks 202/204 of the example of FIG. 4B each contain 128 physical pages 201. In spreading the mapping information across the channels 454, the last valid page 201 of the channel $454_0$ could store mapping information for the first 16 logical page addresses of the logical data block 456, the last valid page 201 of the channel $454_1$ could store mapping information for the next 16 logical page addresses of the logical data block 456, the last valid page 201 of the channel $454_2$ could store mapping information for the next 16 logical page addresses of the logical data block 456, and so on. In this manner, the complete mapping information for all 128 logical page addresses of the logical data block 456 can be found by reading the last valid page 201 of the virtual block 452.

Although eight channels 454 were used in each of the examples of FIGS. 4A and 4B, fewer or more channels 454 can be used. By increasing the fraction of logical page addresses having their mapping information stored on any one channel 454, fewer channels 454 may be used. By increasing the number of channels 454 used, each channel 454 can store mapping information for a smaller fraction of logical page addresses. However, each such variation should treat the resulting logical data block 456 as a unit when writing to any portion of the physical pages 201 associated with the logical data block 456.

In the embodiments described with reference to FIGS. 4A-4B, the last valid physical page held one copy of the mapping information for the corresponding logical data block 456. However, in cases where each physical page 201 of a channel 454 has sufficient capacity available to store more metadata sub-portions than are required to store mapping information for all logical page addresses of the logical data block 456, it may be possible to store multiple copies of the mapping information across the channels 454. For example, if the logical data block 456 has 128 logical page addresses, and 8 channels 454 are utilized, the last valid page 201 of each channel 454 would be required to store mapping information for 16 logical page addresses in order to collectively store mapping information for all 128 logical page addresses. But, if there is sufficient space in each physical page 201 to store mapping information for 32 logical addresses, two copies of the mapping information may be stored. For example, the last valid pages 201 of the channels $454_0$-$454_3$ could collectively store a first copy of mapping information for all 128 logical page addresses of the logical data block 456, and the last valid pages 201 of the channels $454_4$-$454_7$ could collectively store a second copy of the mapping information for all 128 logical page addresses of the logical data block 456. In this manner, even if there are data corruption issues in reading the last valid pages 201, it may be possible to re-create the mapping information for the logical data block 456 using pages 201 that are not subject to data corruption.

In operation, when user data is received by a memory module 106 for writing to one of its memory devices 116, the control circuitry 110 would combine the user data with the metadata representative of the mapping information of the logical data block corresponding to the page 201 to which the user data is to be written. This metadata would be written to the metadata portion 314 concurrently with writing of the user data to the user data portion 312 and/or with writing of the ECC data to the ECC portion 316.

Each memory module 106 would have its own set of mapping information independent of other memory modules 106. The control circuitry 110 stores the mapping information for access of its corresponding memory devices 116. It will be appreciated that a logical address within a memory device 116 may be only a portion of a logical address received from a host. For example, where the SSD 100 contains four memory modules 106, each containing sixteen memory devices 116, and each memory device 116 having 1,920 addressable logical data blocks with 64 pages per block, a portion of the logical address would define which memory module 106, and which memory device 116 of that memory module 106, contained the addressed logical data block. Thus, the mapping information combined with user data as described herein defines mapping information for at least a portion of the logical data block associated with the physical page containing the metadata, but may not define mapping information as to which memory device or which memory module is associated with that logical data block.

Figure 5:
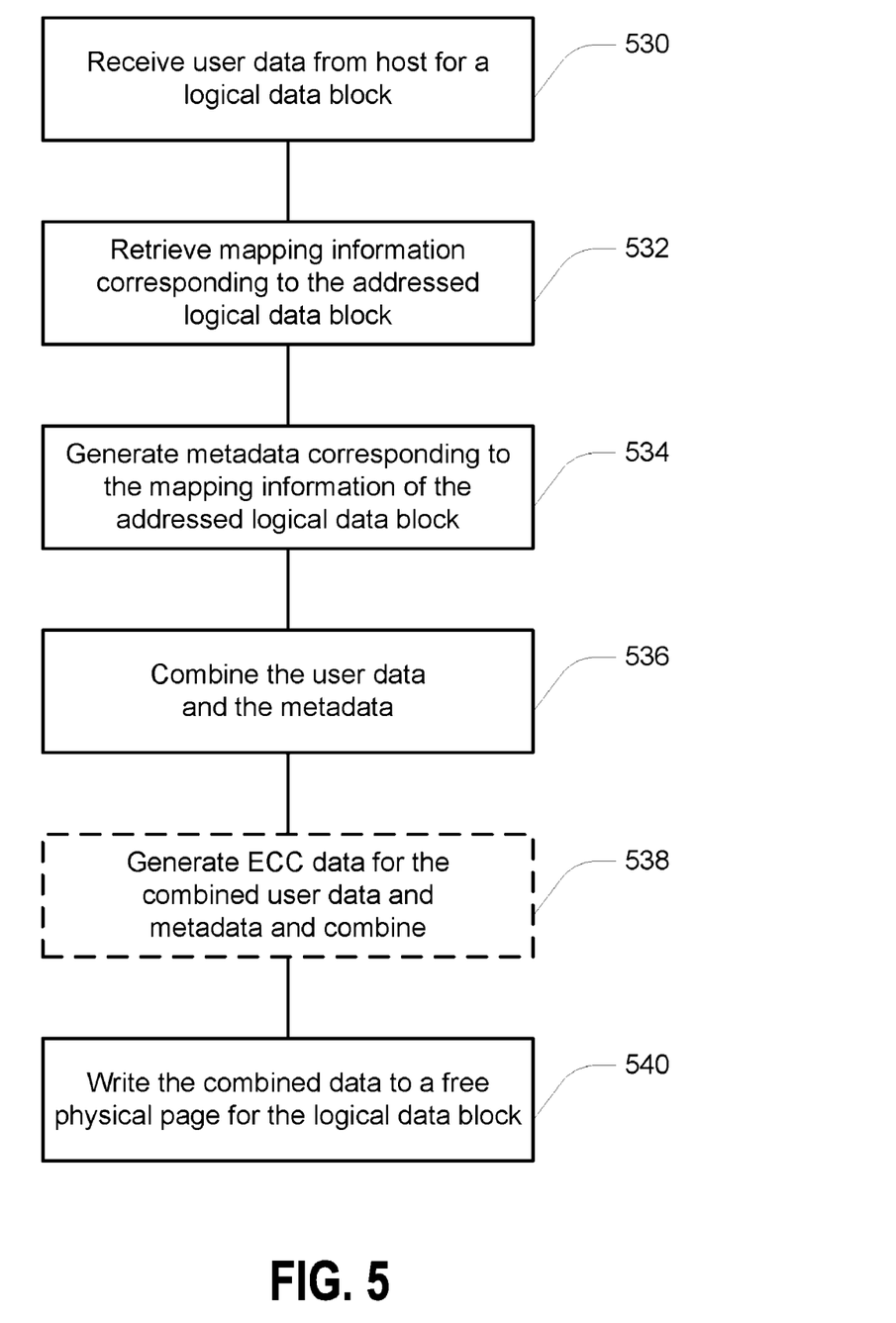
FIG. 5 is a flowchart of a method of operating a memory module in accordance with an embodiment of the disclosure.

FIG. 5 is a flowchart of a method of operating a memory module in accordance with an embodiment of the disclosure. At 530, user data is received from a host for writing to a logical data block of at least one memory device. For example, a host may issue a write command to the memory module, providing data to be written to the memory module and a logical address corresponding to where the data is to be written. The logical address specifies a logical data block and a logical page address for storing the user data. At 532, the control circuitry of the memory module retrieves mapping information corresponding to the addressed logical data block. The control circuitry may retrieve the mapping information prior to or after selecting the next free physical page associated with the logical data block. However, if the mapping information is retrieved prior to being revised to show the intended physical page corresponding to the addressed logical page, it should be updated prior to generating the metadata as described below.

At 534, metadata is generated corresponding to the mapping information of the addressed logical data block. The metadata is indicative of a mapping correspondence between logical page addresses, for at least a portion of the logical data block, and the physical pages addresses associated with that logical data block. It will be understood that the metadata includes mapping information for at least one logical page address other than the logical page address of the current write command. That is, the metadata corresponds to mapping information for two or more logical page addresses of the addressed logical data block. As noted above, the metadata might include a physical page address within a physical block associated with the logical data block, an indication whether the physical block containing the physical page is a data block or a log block, and an indication of a block sequence number if the physical page is contained in one of a plurality of log blocks associated with the logical data block.

At 536, the user data and the metadata are combined. As one example, the metadata is appended to the user data. For example, if the user data is 2,048 Bytes, and the metadata is 32 Bytes, the combined data would be a string of 16,640 data values, with the first 16,384 data values being user data and the last 256 data values being metadata. Optionally, at 538, ECC data is generated for the combined user data and metadata. While, for practicality, ECC should be used for correction of data read errors, it need not be stored with the data that it is used to correct. However, for one embodiment, the ECC data is combined with the combined user data and metadata. As one example, the ECC data is appended to the combined user data and metadata.

At 540, the combined data is then written to the free physical page selected by the control circuitry, thus storing the current mapping information for the corresponding logical data block within the physical page. Higher level mapping information retained by the control circuitry of the memory module should then be updated as is common in the art. It is noted that various embodiments described herein do not rely on a specific application of a Flash Translation Layer or other mapping technique. Similarly, the various embodiments do not interfere with higher level mapping information. Thus, wear leveling, garbage collection and other maintenance activities within the memory module can operate without adversely affecting, or being adversely affected by, such embodiments. What the embodiments provide is an ability to re-build mapping information more efficiently than a process of scanning through every valid page of a memory device. Because various embodiments facilitate re-building the mapping information for a memory device by scanning only one valid page of each logical data block of the memory device, rather than all valid pages of all logical data blocks, the scanning process is greatly simplified.

Figure 6:
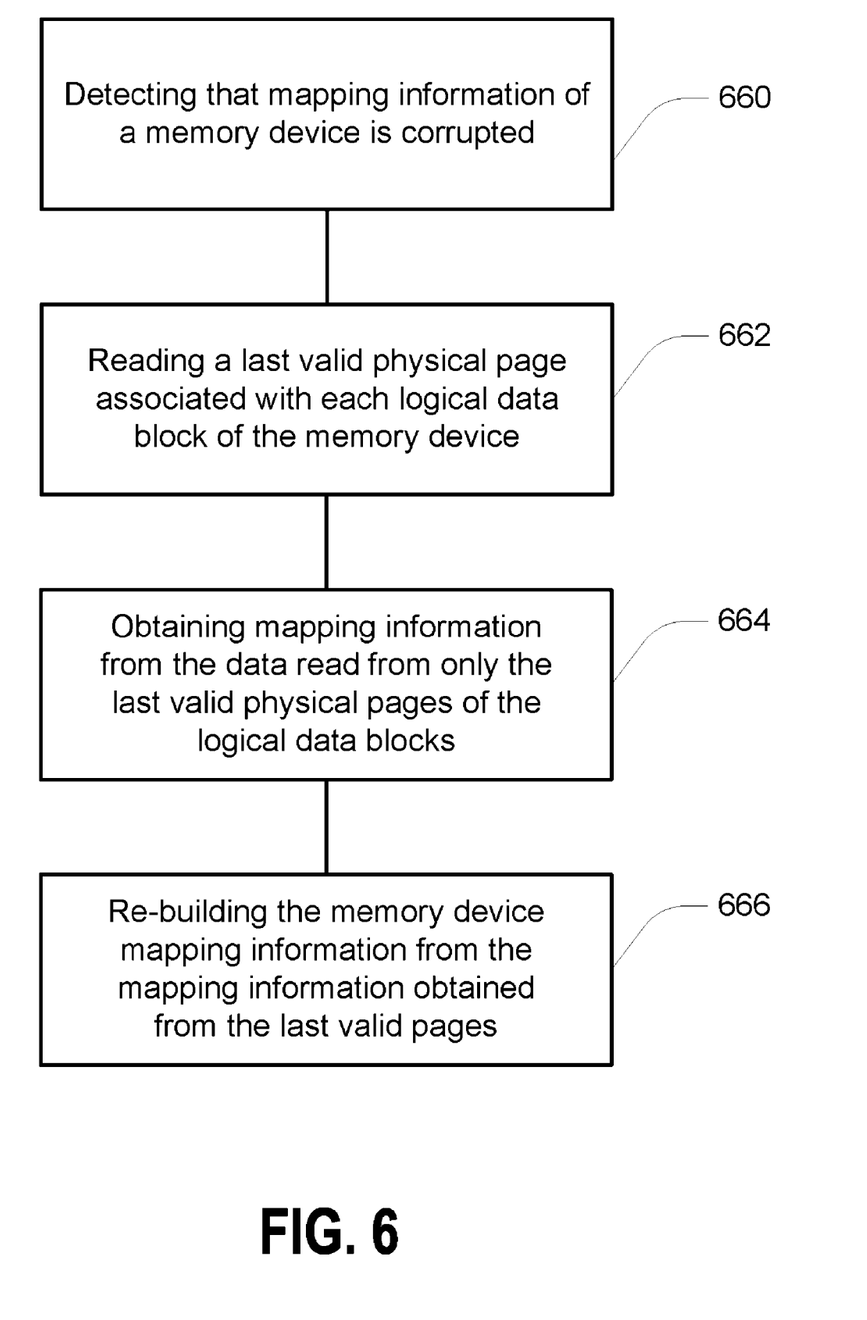
FIG. 6 is a flowchart of a method of operating a memory module in accordance with an embodiment of the disclosure.

FIG. 6 is a flowchart of a method of operating a memory module in accordance with an embodiment of the disclosure. At 660, mapping information of a memory device is detected to be corrupted. Such corruption may occur by powering down the memory device before a write operation is complete. As one example, by setting a non-volatile register to indicate that a write operation is underway, and only re-setting it upon completion of that write operation, any interruption of that write operation can be detected upon powering up the memory module by simply checking the value of the register.

At 662, upon detecting corruption of mapping information of a memory device, the control circuitry would begin a scan process to read the last valid physical page associated with each logical data block of that memory device. There is no need to read additional pages of memory as, in accordance with the various embodiments, the mapping information for the memory device may be re-built using only information stored in the last valid physical page of each logical data block addressed by the memory device.

At 664, the mapping information is obtained from the data read from only the last valid physical page of the logical data blocks. Obtaining the mapping information may include either reading only those memory cells necessary to obtain the mapping information, or it may include reading all memory cells of the physical page, and extracting the mapping information from the data obtained. Obtaining the mapping information may further include applying error correction using the ECC data.

At 666, the mapping information for the memory device is re-built using the mapping information obtained from the last valid physical pages of the logical data blocks. For memory modules containing more than one memory device, the process from 662-666 can be repeated for each memory device of the memory module, or it may only be performed for those memory devices indicating a corruption of their mapping information. The re-built mapping information may then be stored by the control circuitry of the memory module.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A device, comprising:
   data storage comprising a plurality of physical data blocks organized into a plurality of logical data blocks, wherein each of the plurality of physical data blocks comprises a plurality of physical pages and wherein each of the plurality of logical data blocks comprises a plurality of logical pages; and
   control circuitry for writing data to a physical page of the data storage in response to a write command associated with an address of a particular logical page of a particular logical data block;
   wherein the control circuitry is configured to write the data to the physical page having a particular data structure;
   wherein, when more than one physical page of the data storage stores valid data corresponding to the particular logical data block, the particular data structure of the physical page to which the data is to be written in response to the write command comprises user data to be received from an external device and a plurality of addresses, each address of the plurality of addresses corresponding to a physical page of the data storage storing valid data corresponding to the particular logical data block;
   wherein the control circuitry is further configured to write at least a portion of the user data to the physical page concurrently with writing at least a portion of the plurality of addresses to the physical page; and
   wherein a first address of the at least a portion of the plurality of addresses is different than a second address of the at least a portion of the plurality of addresses.

2. The device of claim 1, wherein each address of the plurality of addresses corresponds to a respective logical page of the particular logical block.

3. The device of claim 2, wherein each logical page of the particular logical block having valid data corresponds to more than one address of the plurality of addresses.

4. The device of claim 1, wherein the physical page of the data storage to which the data is to be written comprises a respective physical page from each physical data block of a grouping of physical data blocks.

5. The device of claim 4, wherein the control circuitry is further configured to write only a portion of the plurality of addresses to the respective physical page of each physical data block of the grouping of physical data blocks.

6. The device of claim 5, wherein the control circuitry is further configured to write mutually exclusive portions of the plurality of addresses to the respective physical page of each physical data block of the grouping of physical data blocks.

7. The device of claim 5, wherein the control circuitry is further configured to write the plurality of addresses to a first portion of the respective physical pages of the grouping of physical data blocks and to a second portion of the respective physical pages of the grouping of physical data blocks.

8. The device of claim 1, wherein the particular logical data block corresponds to a grouping of physical data blocks of the plurality of physical data blocks.

9. The device of claim 8, wherein the particular data structure further comprises respective additional data corresponding to each address of the plurality of addresses, and wherein the respective additional data for a particular address of the plurality of addresses is indicative of which physical data block of the grouping of physical data blocks contains the physical page corresponding to the particular address.

10. A method of operating a memory module, comprising:
    receiving data from a device external to the memory module in association with a write command, wherein the received data is addressed by the write command to be stored to a particular logical page of a particular logical data block of the memory module during a single write operation to the particular logical data block;
    combining the received data with a plurality of addresses to generate combined data; and
    writing the combined data to a free physical page of the memory module associated with the particular logical data block during the single write operation to the particular data block;
    wherein each address of the plurality of addresses corresponds to a respective physical page of the memory module associated with a respective logical page of the particular logical data block and associated with valid data.

11. The method of claim 10, wherein writing the combined data to the free physical page of the memory module comprises writing a portion of the combined data to a respective physical page from each physical data block of a plurality of physical data blocks.

12. A device, comprising:
    data storage comprising a plurality of physical data blocks organized into a plurality of logical data blocks, wherein each of the plurality of physical data blocks comprises a plurality of physical pages and wherein each of the plurality of logical data blocks comprises a plurality of logical pages; and
    control circuitry for writing data to a physical page of the data storage in response to a write command associated with an address of a particular logical page of a particular logical data block;
    wherein the control circuitry is configured to write the data to the physical page having a particular data structure;
    wherein the particular data structure of the physical page of the data storage to which the data is to be written in response to the write command comprises user data to be received from an external device and metadata to be generated by the control circuitry;
    wherein, when at least one other physical page of the data storage stores valid data corresponding to the particular logical data block, the metadata of the particular data structure comprises an address corresponding to the physical page of the data storage to which the data is to be written in response to the write command, and further comprises an address corresponding to a different physical page of the data storage containing valid data, and corresponding to a different logical page of the particular logical data block;
    wherein the control circuitry is further configured to write at least a portion of the user data to the physical page concurrently with writing at least a portion of the metadata to the physical page; and
    wherein the at least a portion of the metadata comprises the address corresponding to the different physical page of the data storage containing valid data.

13. The device of claim 12, wherein the metadata of the particular data structure further comprises an additional address corresponding to an additional physical page of the data storage corresponding to the particular logical page of the particular logical data block.

14. The device of claim 12, wherein the metadata of the particular data structure further comprises an additional address corresponding to an additional physical page of the data storage corresponding to an additional different logical page of the particular logical data block.

15. The device of claim 12, wherein the control circuitry is further configured to write additional data to an additional physical page of the data storage in response to the write command associated with the address of the particular logical page of the particular logical data block and having the particular data structure.

16. The device of claim 15, wherein the physical page of the data storage to which the data is to be written in response to the write command occurs at a particular physical page offset of a particular physical data block, and wherein the additional physical page of the data storage to which the additional data is to be written in response to the write command occurs at the particular physical page offset of a different physical data block.

17. The device of claim 12, wherein the physical page of the data storage to which the data is to be written in response to the write command and the different physical page of the data storage correspond to a same physical data block.

18. The device of claim 12, where each logical data block of the plurality of logical data blocks corresponds to more than one physical data block of the plurality of physical data blocks.

19. The device of claim 18, wherein the physical page of the data storage to which the data is to be written in response to the write command corresponds to a particular physical data block and the different physical page of the data storage corresponds to a different physical data block.

20. The device of claim 19, wherein the different physical data block comprises a log block associated with the particular physical data block.

21. The device of claim 12, wherein the physical page of the data storage comprises a respective physical page from each physical data block of a grouping of physical data blocks, and wherein the address corresponding to the physical page of the data storage is a single address.

* * * * *